(12) United States Patent
Fujii et al.

(10) Patent No.: US 8,495,410 B2
(45) Date of Patent: Jul. 23, 2013

(54) SAMPLING PHASE CORRECTING HOST CONTROLLER, SEMICONDUCTOR DEVICE AND METHOD

(75) Inventors: Noriyo Fujii, Ome (JP); Masayoshi Murayama, Hanno (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 307 days.

(21) Appl. No.: 13/075,304

(22) Filed: Mar. 30, 2011

(65) Prior Publication Data
US 2012/0049919 A1 Mar. 1, 2012

(30) Foreign Application Priority Data
Aug. 31, 2010 (JP) ................................. 2010-194929

(51) Int. Cl.
*G06F 1/04* (2006.01)
(52) U.S. Cl.
USPC ............................ 713/503; 713/400; 713/401
(58) Field of Classification Search
None
See application file for complete search history.

(56) References Cited

U.S. PATENT DOCUMENTS

| | | | | |
|---|---|---|---|---|
| 8,286,024 | B2* | 10/2012 | Fujimoto | 713/503 |
| 2007/0217559 | A1* | 9/2007 | Stott et al. | 375/355 |
| 2010/0118627 | A1* | 5/2010 | Best | 365/193 |

FOREIGN PATENT DOCUMENTS

| | | |
|---|---|---|
| JP | 02-250535 | 10/1990 |
| JP | 04-235428 | 8/1992 |
| JP | 2003-333021 | 11/2003 |
| JP | 2004-274293 | 9/2004 |
| JP | 2005-073040 | 3/2005 |
| JP | 2007-034540 | 2/2007 |
| JP | 2008-090556 | 4/2008 |
| KR | 10-2007-0026079 | 3/2007 |

OTHER PUBLICATIONS

Korean Office Action for Korean Application No. 10-2011-23434 mailed on Aug. 17, 2012.
Japanese Office Action for Japanese Application No. 2010-194929 mailed on Nov. 27, 2012.

* cited by examiner

*Primary Examiner* — Dennis M Butler
(74) *Attorney, Agent, or Firm* — Turocy & Watson, LLP

(57) ABSTRACT

One embodiment provides a host controller which performs a phase shift correction of a sampling clock when sampling a signal received, includes a phase shift judging section which judges whether or not it is necessary to shift a phase of the sampling clock, and up/down counts a counter in accordance with a shift direction when judging that it is necessary to shift the phase, a limit value storage section which stores a variance range limit value of the phase shift, and a shift limit judging section which judges whether or not a value of the counter exceeds the limit value of the phase shift, notifies a host device of an error when judging that the counter value exceeds the limit value, and shifts the phase of the sampling clock in accordance with the counter value of the counter when judging that the counter value does not exceed the limit value.

16 Claims, 7 Drawing Sheets

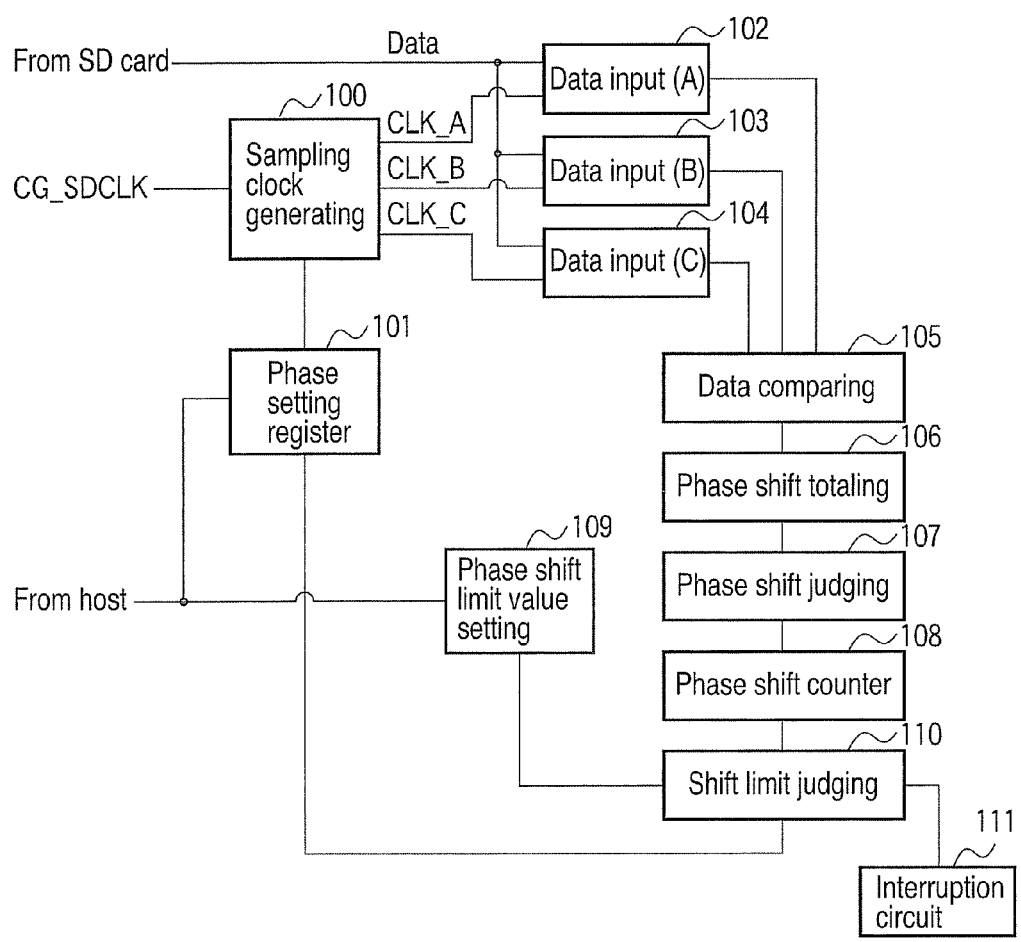
F I G. 2

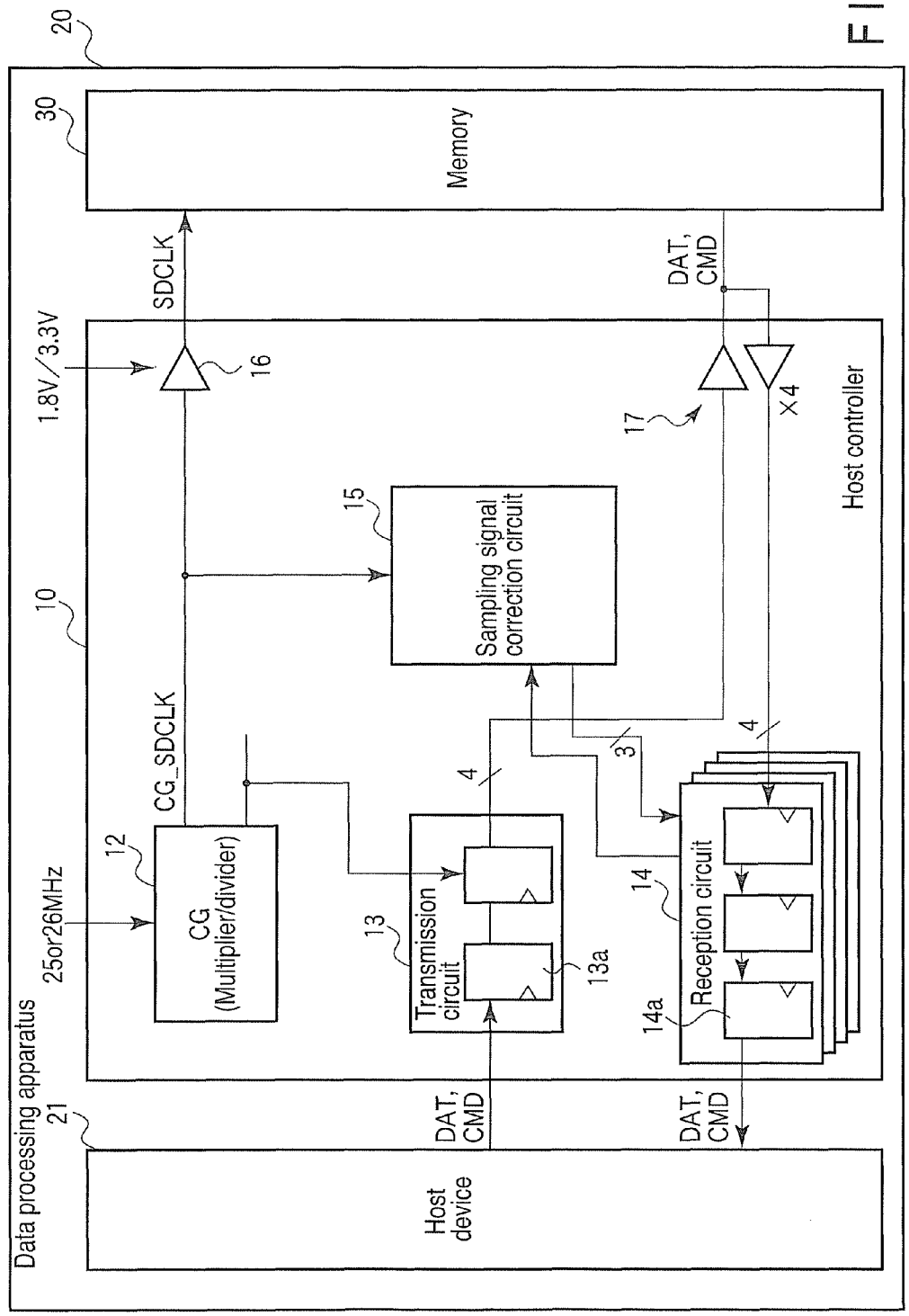
F I G. 6

SAMPLING PHASE CORRECTING HOST CONTROLLER, SEMICONDUCTOR DEVICE AND METHOD

CROSS-REFERENCE TO RELATED APPLICATIONS

This application is based upon and claims the benefit of priority from Japanese Patent Application No. 2010-194929, filed Aug. 31, 2010; the entire contents of which are incorporated herein by reference.

FIELD

Embodiments descried herein relate generally to a host controller and semiconductor device which perform input/output processing of data to/from a memory device, whereby a temperature drift error is detected when reading the data received from the memory device, to correct a sampling phase, and a correction method of the sampling phase.

BACKGROUND

An SD card widely spreads as a small portable nonvolatile memory for use in portable equipment such as a digital camera or a cellular phone, or electrical household equipment such as a PC or a television set. Transfer of data and a command between the SD card and a host device (CPU) is controlled by a host controller.

The latest SD card has a much higher transfer speed than the conventional SD card, and hence data cannot appropriately be sampled with a previous fixed delay amount during data reception, and it becomes necessary to set a phase of a sampling position.

To set the phase of a sampling clock, tuning is usually performed before actually transferring the data, to judge an optimum phase. The tuning means an operation of determining an optimum sampling position in an initialization sequence of the SD card. That is, the host device changes a shift amount of the sampling clock little by little to repeatedly read and sample a tuning pattern from the SD card. This tuning pattern is an already known data pattern, and the same pattern is beforehand stored in both the SD card and the host controller. The host device judges whether or not the data obtained by this sampling matches the tuning pattern stored in the host controller, and determines, as the optimum sampling position, the shift amount with which correct data is most stably obtained.

However, if the phase shifts owing to a temperature or the like during the transfer, the shift cannot be detected, whereby re-tuning needs to be performed every short transfer interval.

To solve the above problem, there has been suggested a host controller which samples received data to detect a phase shift, thereby obtaining information for judging whether or not the re-tuning is necessary. Only when the phase shift occurs, the host controller performs the re-tuning. This host controller automatically corrects the sampling position based on the phase shift detection result. This enables a countermeasure against the phase shift, but there has been a problem that it is not possible to detect a phase shift error which exceeds an allowable variance range of the phase shift.

BRIEF DESCRIPTION OF THE DRAWINGS

FIG. 2 is a block diagram showing a constitution of a sampling signal correction circuit 15;

FIG. 6 is a block diagram showing the constitution of the main part of the data processing system according to a second embodiment.

DETAILED DESCRIPTION

In general, according to one embodiment, there is provided a host controller which performs a phase shift correction of a sampling clock used for sampling a signal, comprising: a phase shift judging section configured to judge whether or not a phase shift of the sampling clock is required, and to count up or down a counter in accordance with a shift direction when the phase shift is required; a limit value storage section configured to store a variance range limit value of the phase shift; and a shift limit judging section configured to judge whether or not a value of the counter exceeds the limit value of the phase shift, notify a host device of an error when the value of the counter exceeds the limit value, and shifts the phase of the sampling clock in accordance with the value of the counter when the value of the counter does not exceed the limit value.

Hereinafter, embodiments of the host controller will be described with reference to the drawings.

Figure 1:
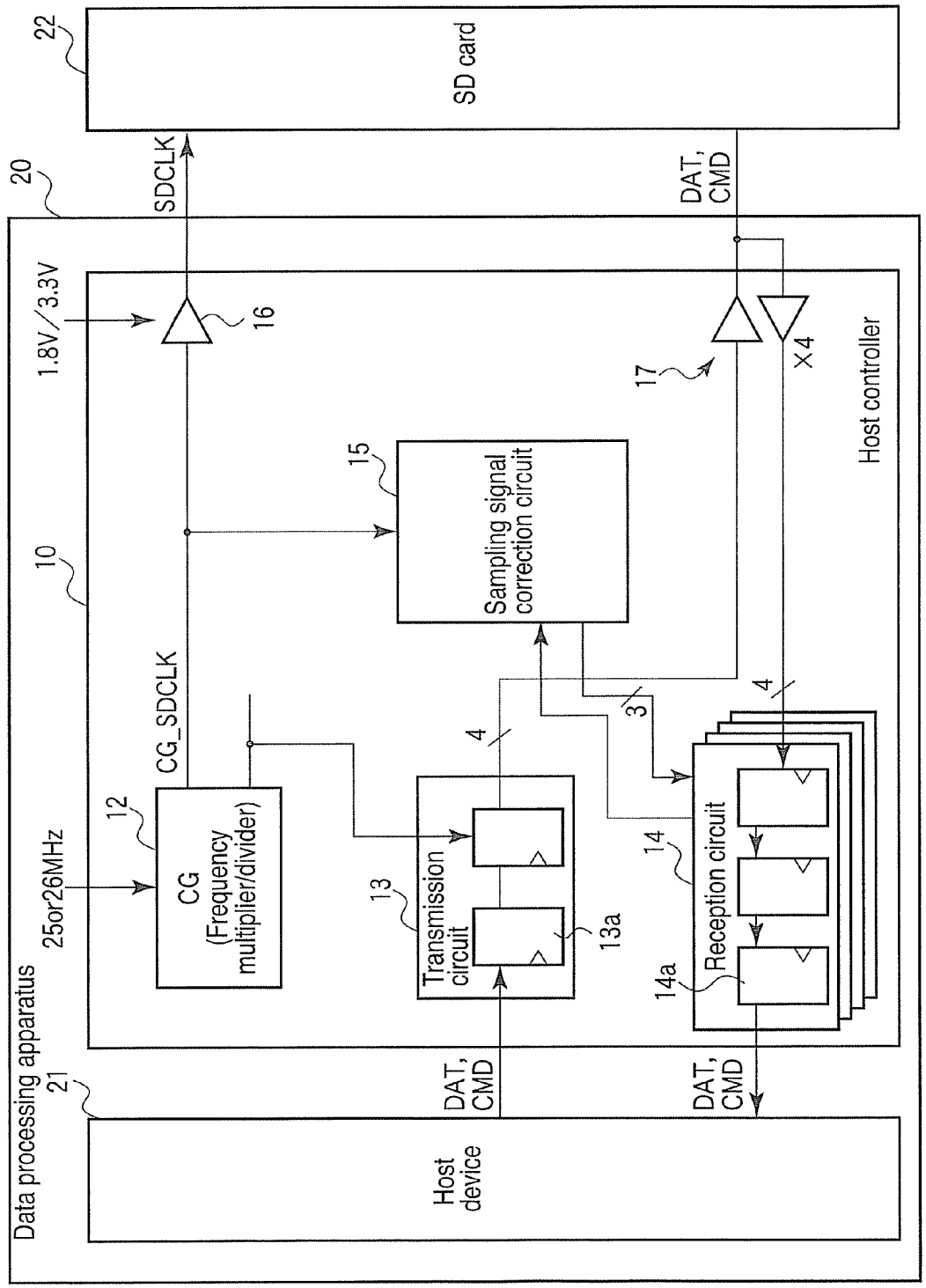
FIG. 1 is a block diagram showing a constitution of a main part of an data processing system to which an embodiment is applied.

FIG. 1 is the whole arrangement of a data processing system to which the embodiment is applied.

The FIG. 1 includes a data processing apparatus 20 and an SD card 22, and the data processing apparatus 20 includes a host device 21 and a host controller 10. The data processing apparatus 20 is electronic equipment such as a digital camera or a PC. The data processing apparatus 20 is connected to the SD card 22 via an external connection terminal (not shown).

The host controller 10 has a constitution of, for example, an LSI, and controls data transfer between the host device 21 and the SD card 22. The host controller 10 performs a function of a host side apparatus which controls the SD card 22, and is, accordingly, referred to also as an SD host controller.

The host controller 10 includes a frequency multiplier/divider 12, a transmission circuit 13, a reception circuit 14, a sampling signal correction circuit 15, an amplifier 16, and an input/output gate 17.

The frequency multiplier/divider 12 multiplies or divides a frequency of a clock CLK generated by setting the frequency of the host device 21, to generate a clock signal, thereby supplying the signal as an operation clock to each part. A clock signal CG_SDCLK is supplied to the sampling signal correction circuit 15. Moreover, the signal is amplified by the amplifier 16, and supplied as a signal SDCLK to the SD card 22.

The transmission circuit 13 synchronously outputs, by a flip-flop (F/F) 13a, signals of transmission data DAT and transmission command CMD transferred from the host device 21 via a plurality of bit lines. The input/output gate 17 controls an input/output transmission path of the signals of the data DAT and the command CMD. The reception circuit 14 synchronously transfers, to the host device 21 by an F/F 14a, signals of the reception data DAT and reception command CMD input from the SD card 22 via a plurality of bit lines.

FIG. 2 is a block diagram showing a basic constitution of the embodiment.

100 is a sampling clock generating section which generates sampling clocks having different phases and is a circuit included in the sampling signal correction circuit 15, and 101 is a phase set register which sets the phase of the sampling clock generated by the sampling clock generating section 100. 102 is a data input section (A) which receives data with sampling clock A, 103 is a data input section (B) which receives data with sampling clock B, and 104 is a data input section (C) which receives data with sampling clock C. 105 is a data comparing section which compares the data received by the data input sections 102, 103, and 104, and 106 is a phase shift totaling section which totals the phase shifts from the comparison result. 107 is a phase shift judging section which judges, from the totaling result of the phase shift totaling section 106, whether or not to shift the phase. 108 is a phase shift counter which counts the phase shift, and 109 is a phase shift limit value setting register which sets a phase shift limit value from the host device 21. 110 is a shift limit judging section which compares the limit value of the phase shift of the register 109 with a count value of the counter 108 to judge whether or not an error occurs, and 111 is an interruption circuit which performs processing as interruption, when the shift limit judging section 110 judges that the error occurs. The circuit blocks 102-111 are circuits included in the reception circuit 14.

Figure 3:
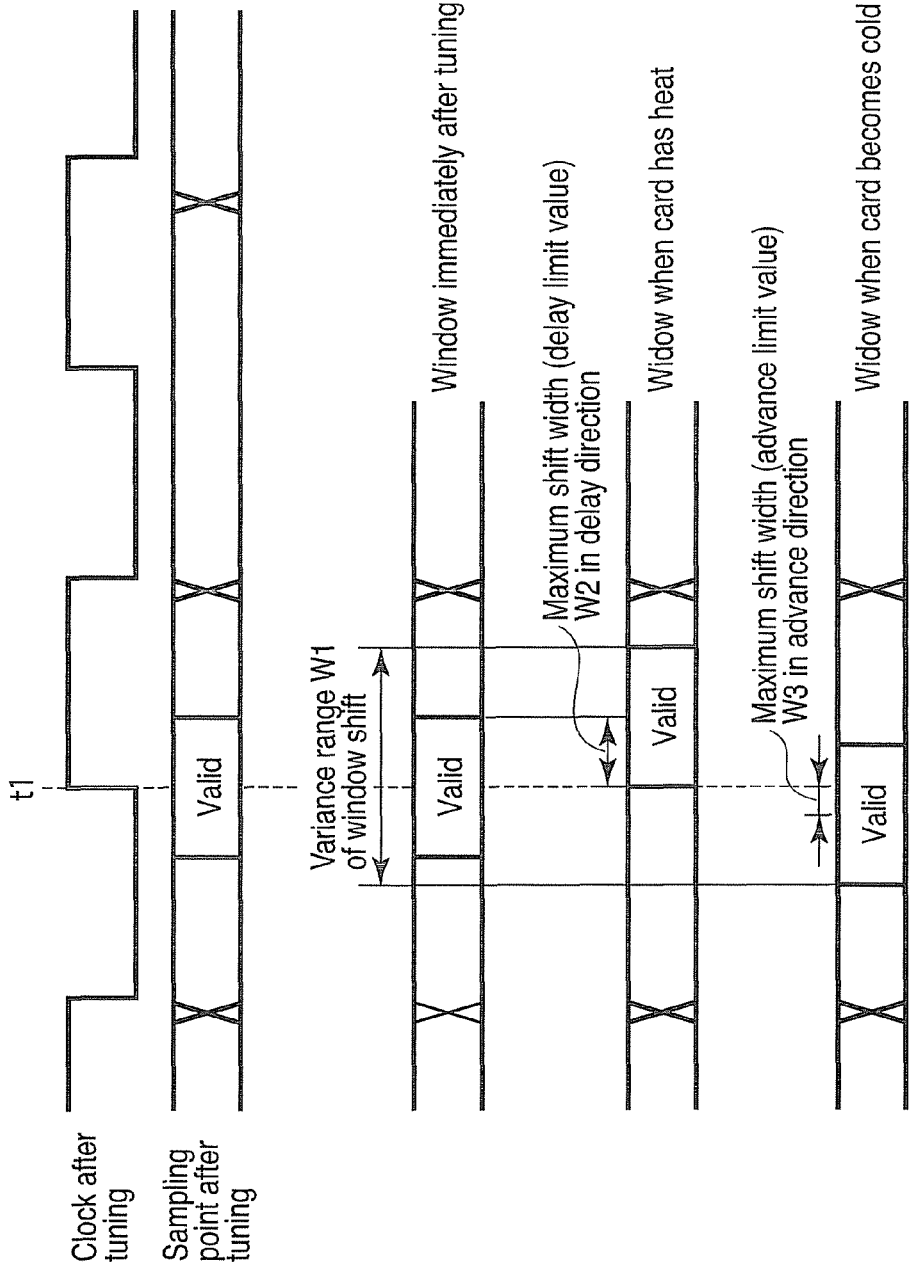
FIGS. 3A, 3B, 3C and 3D are diagrams showing a variance of a valid region of data received from an SD card.

FIG. 3 shows a variance of a valid region of the data received from the SD card 22.

The data valid region varies in accordance with a change of an ambient temperature. In general, there is regulated a maximum shift width (a variance range) W1 between a case where the temperature rises and a case where the temperature lowers, depending upon the type or operation mode of the card. The width W1 is an adequate phase setting range, and a sampling phase needs to be set within this adequate phase setting range. The adequate phase setting range W1 is regulated as time from a data change point. Therefore, when the data sampling phase exceeds the data valid region within the adequate phase setting range W1, a notifying function of this effect is necessary.

FIGS. 3A and 3B show data valid regions immediately after the tuning. Immediately after the tuning, a sampling point (the sampling phase) t1 of a sampling clock matches the center of the data valid region.

FIG. 3C shows a time when the SD card 22 has heat and the valid region shifts most in a delay direction within the adequate phase setting range W1. W2 is the maximum shift width (a delay limit value) in the delay direction.

FIG. 3D shows a time when the SD card 22 becomes cold and the valid region shifts most in an advance direction within the adequate phase setting range W1. W3 is the maximum shift width (an advance limit value) in the advance direction.

Figure 4:
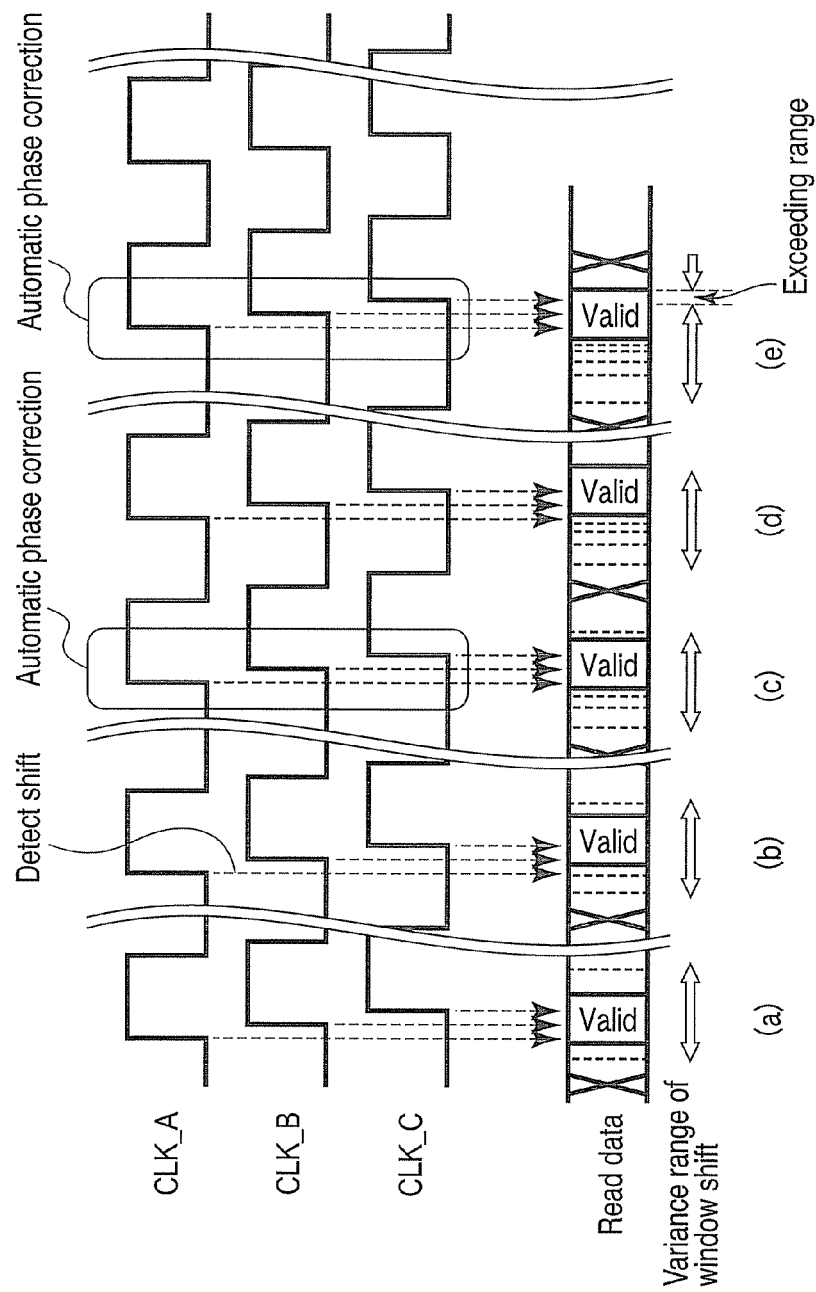
FIG. 4 is a diagram showing an outline of a sampling phase correcting operation.

FIG. 4 shows an outline of a sampling phase correcting operation.

The phase shifts are detected to correct the phases in three-phase clocks CLK_A, CLK_B, and CLK_C.

The phase is automatically corrected based on the detected shift of the data valid region. Therefore, if the valid region exceeds the adequate phase setting range W1, data cannot correctly be sampled, and the data error occurs.

FIG. 4(a) shows a state where all the phases of the three-phase clocks CLK_A, CLK_B, and CLK_C fall within the valid region. Data is actually sampled by using, for example, the center clock CLK_B. FIG. 4(b) shows a state where the valid region shifts in the delay direction and the shift is detected by the clock CLK_A. When the shift is detected in this manner, as shown in FIG. 4(c), the phase is corrected so that the three-phase clocks CLK_A, CLK_B, and CLK_C sample the data in the valid region.

FIG. 4(d) shows a state where the valid region further shifts in the delay direction and the shift is detected by the clock CLK_A. When the shift is detected in this manner, as shown in FIG. 4(e), the phase is corrected so that the three-phase clocks CLK_A, CLK_B, and CLK_C sample the data in the valid region again. In this case, however, the valid region exceeds the adequate phase setting range W1. Therefore, if the data is received as it is and the data is sampled by using the center clock CLK_B, a data error might occur.

Next, an operation of the embodiment will be described with reference to FIG. 2.

First, the host device 21 (FIG. 1) sets, to the phase setting register 101, three mutually different phases based on the signal CG_SDCLK. At this time, the optimum phase obtained by the above tuning is set to the phase of the center clock CLK_B. The sampling clock generating section 100 generates three clocks CLK_A, CLK_B, and CLK_C having three phases supplied from the phase setting register 101, respectively. The data input sections 102, 103 and 104 sample the read data by use of the three clocks as shown in FIG. 4. The data comparing section 105 compares three data obtained every sampling period with one another.

The phase shift totaling section 106 totals data block (e.g., 512 bytes) units of the comparison result of the data comparing section 105 until the end of the block transfer. The data totaled at this time are, for example, 111, 111, 110, 111 . . . . When the three data are the same, all the sampling clocks CLK_A, CLK_B and CLK_C sample the data in the valid regions shown by "Valid" in FIG. 4.

The phase shift judging section 107 judges whether or not to shift the phase. If a state where three data obtained every sampling period are different from one another continues, for example, as much as a predetermined number of times, the phase shift judging section 107 judges that it is necessary to shift the phase. The phase shift judging section 107 changes the counter value of the phase shift counter 108 in accordance with a shift amount. When the phase shift judging section 107 judges that it is necessary to shift the phase, for example, on an advance side, the section counts down by −1. Moreover, when the section judges that it is necessary to shift the phase on a delay side, the section counts up the counter by +1.

Here, in the phase shift limit value setting section 109, the delay limit value W2 and the advance limit value W3 of FIG. 3 are converted into values W2c and W3c corresponding to the count values of the phase shift counter 108, which are set. The shift limit judging section 110 compares the delay limit value W2c and the advance limit value W3c with the phase shift counter values to judge whether or not the values deviate from the limit values.

When the shift limit judging section 110 judges that the phase shift counter value does not deviate from the limit value, the section updates the value of the phase setting register 101 to shift the phase.

That is, the section adds a phase difference corresponding to the counter value of the phase shift counter 108 to registers for the clocks CLK_A, CLK_B, and CLK_C in the phase setting register 101, respectively.

When the shift limit judging section 110 judges that the phase shift counter value deviates from the limit value, the section transmits an interruption signal to the host device 21 in the interruption circuit 111 to notify the host device that the limit value is exceeded, i.e., notify the unit of an error. Even if it is judged that the error occurs in limit judgment processing, the section only notifies the host device of the error and can continue to transfer the data.

Next, a further concrete embodiment will be described.

Figure 5:
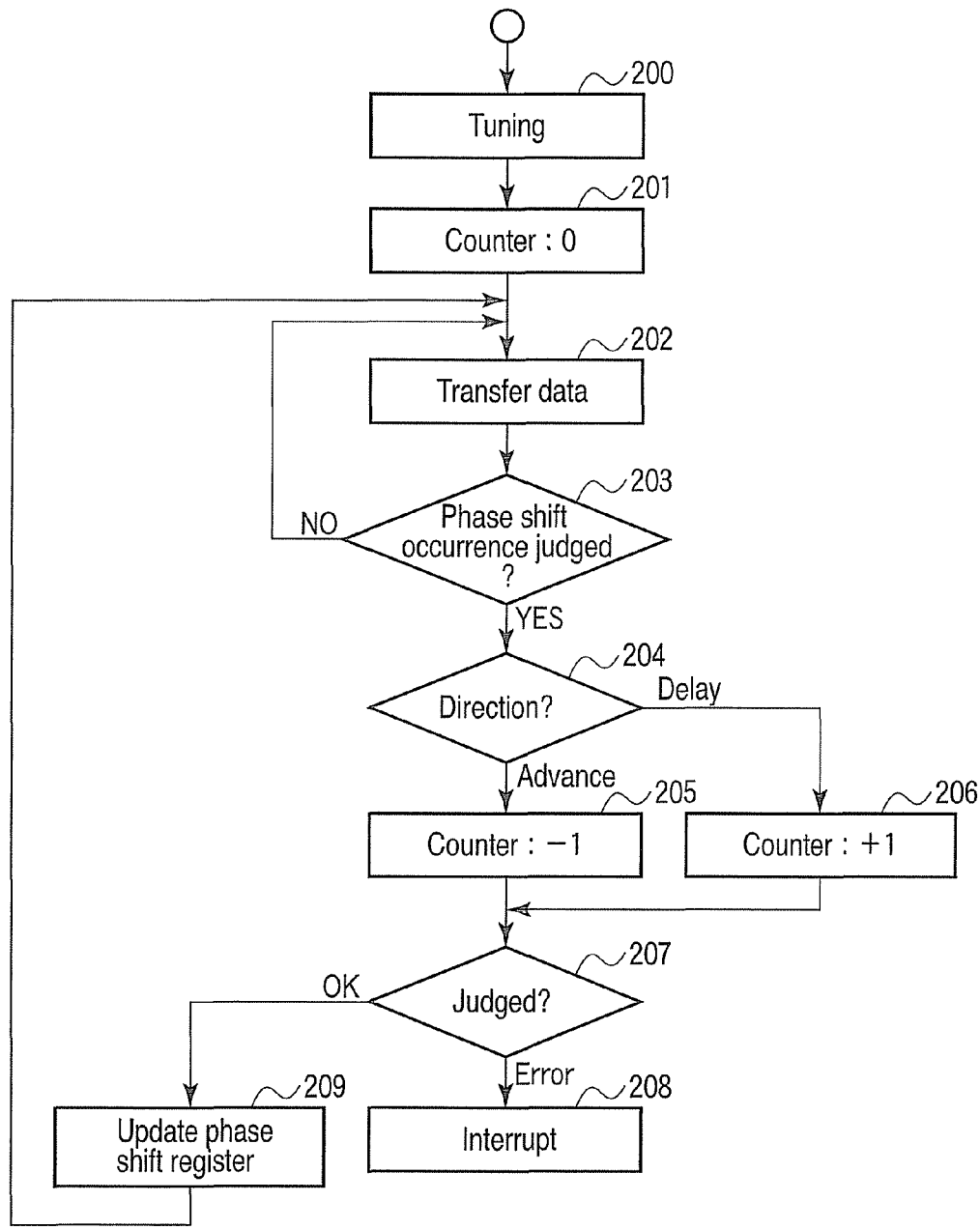
FIG. 5 is a flowchart showing a specific example to update a value of a phase shift counter.

FIG. 5 is a flowchart showing a specific example to update a value of a phase shift counter, under the control of the host device 21.

First, in a block 200, the host device 21 performs the above tuning, sets the optimum phase to the clock CLK_B by use of the phase setting register 101, and sets, to the clocks clock CLK_A and clock CLK_B, phases which shift forwards and backwards as much as a predetermined phase difference. In a block 201, the host device 21 initializes the counter value of the phase shift counter 108 to 0.

A block 202 transfers data between the SD card 22 and the host controller. In a block 203, the phase shift judging section 107 judges whether or not the phase shift has occurred. If the section judges that the phase shift has occurred, a processing flow goes to a block 204. If the section judges that any phase shift has not occurred, the flow goes to the block 202.

When the phase shift has occurred, in the block 204, the flow branches in accordance with a shift direction. When the phase shifts in the advance direction, a block 205 subtracts 1 from the counter value of the phase shift counter. When the phase shifts in the delay direction, a block 206 adds 1 to the counter value.

A block 207 compares the limit values W2c and W3c set to the limit value setting section 109 with the counter values. When it is judged that an error occurs, a block 208 generates an interruption signal to notify the host device of the error. When it is judged that the counter value is OK, the flow goes to a block 209 to update the phase shift register 101.

As described above, the data valid region changes in accordance with a temperature drift. According to the present embodiment, when the change amount exceeds the phase shift limit value, i.e., an error occurs, the error can be detected immediately after the occurrence of the error. Therefore, the early detection of the error, improvement of reliability of the transferred data and improvement of an error handling performance are realized.

It is to be noted that in the above embodiment, the delay limit value W2 and advance limit value W3 determined as standards are set to the phase shift limit value setting section 109, but the other values may be set from the host device 21. In consequence, the range of the shift limit judgment can be enlarged.

In addition, it is possible to handle even the change of the variance range of the temperature drift due to an environmental change.

For example, in a system which lightly performs error correction processing, i.e., in which an error is strictly limited, a phase shift limit value is set to be small. In a system which sufficiently performs the error correction processing, a phase shift limit value may be set to be large. Moreover, when the phase change amount in one shift is set to be large (resolution of the phase setting register is set to be low), the phase shift limit value is set to be small, whereby accuracy of the detection of a limit value exceeding error can be prevented from being lowered.

FIG. 6 is a block diagram showing a constitution of the main part of the data processing system according to a second embodiment.

In the data processing system according to this embodiment, the data processing system 20 have a memory device 30, host device 21 and a host controller 10 built-in. It is considered that the memory device 30, the host device 21 and the host controller 10 have various configurations such as a configuration in which the memory, the host device and the host controller are disposed in the same housing, or on the same substrate or the like, in accordance with the type and use application of the system.

Figure 7:
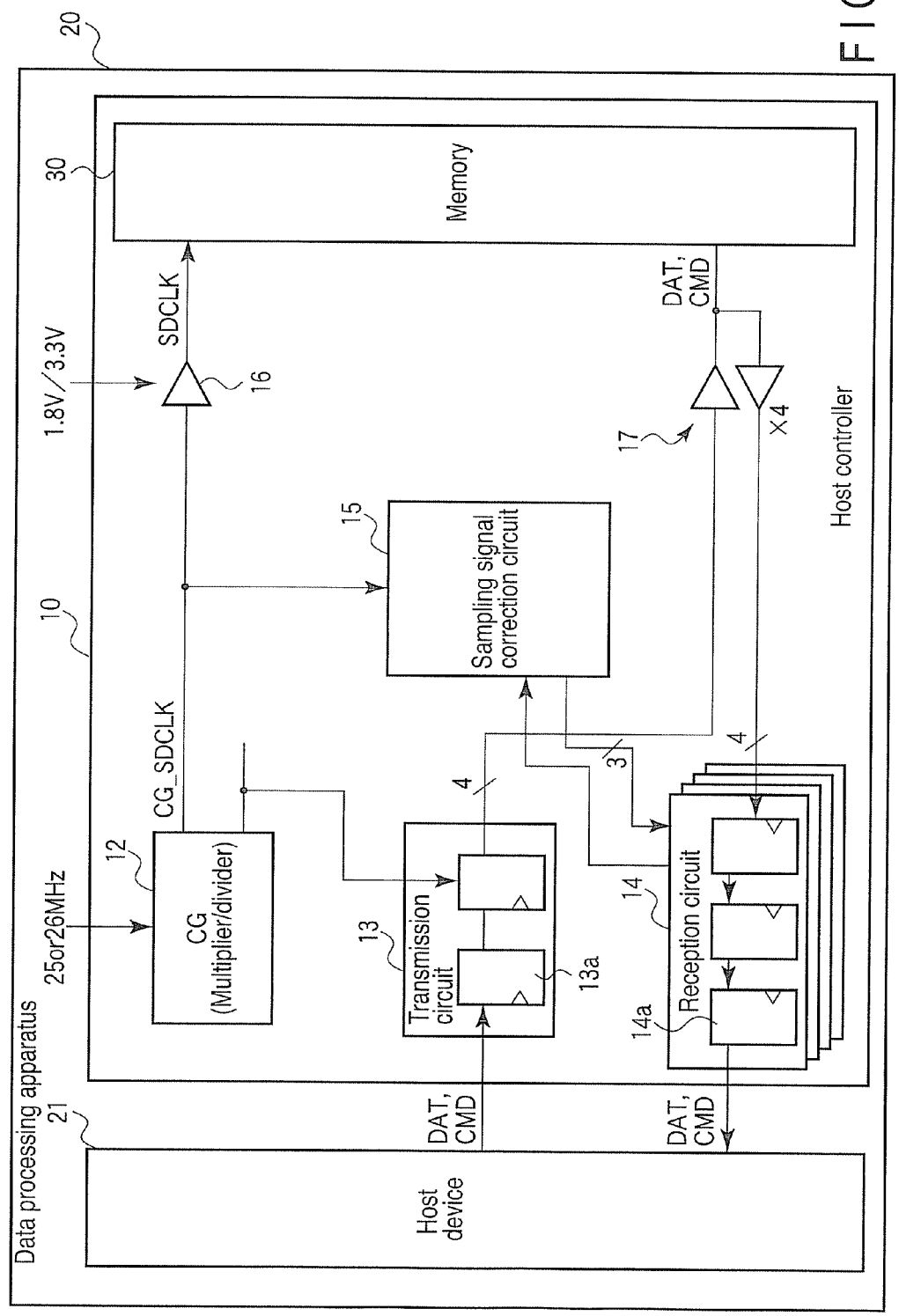
FIG. 7 is a block diagram showing the constitution of the main part of the data processing system according to a third embodiment.

FIG. 7 is a block diagram showing a constitution of the main part of the data processing system according to a third embodiment.

In the data processing system according to the present embodiment, a memory device 30 is arranged in a host controller 10. The host controller 10 may be disposed on a single substrate, or disposed as a single semiconductor chip. It is considered that the host controller 10 and the host device 21 have various configurations such as a configuration in which the host controller and the host device are disposed in the same housing, or on the same substrate or the like, in accordance with the type and use application of the system.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A host controller which performs a phase shift correction of a sampling clock used for sampling a signal, comprising:
   a phase shift judging section configured to judge whether or not a phase shift of the sampling clock is required, and to count up or down a counter in accordance with a shift direction when the phase shift is required;
   a limit value storage section configured to store a variance range limit value of the phase shift; and
   a shift limit judging section configured to judge whether or not a value of the counter exceeds the limit value of the phase shift, notify a host device of an error when the value of the counter exceeds the limit value, and shifts the phase of the sampling clock in accordance with the value of the counter when the value of the counter does not exceed the limit value.

2. The host controller of claim 1, wherein the variance range limit value of the phase shift includes a maximum shift width in a delay direction and a maximum shift width in an advance direction.

3. The host controller of claim 1, wherein the phase shift judging section is configured to sample received data by use of a plurality of clock signals having mutually different phases, to judge whether or not the phase shift of the sampling clock is required, based on obtained data values.

4. The host controller of claim 1, wherein the signal is received from a memory device, the host controller being configured to read a tuning pattern from the memory device to perform tuning at the start of data transfer of the memory device, judge an optimum phase of the sampling clock, and supply the optimum phase to a center clock among a plurality of clock signals.

5. The host controller of claim 4, wherein the memory device is an SD card.

6. A semiconductor device including a host controller configured to perform a phase shift correction of a sampling clock used for sampling a signal, comprising:
   a phase shift judging section configured to judge whether or not a phase shift of the sampling clock is required, and to count up or down a counter based on a shift direction when the phase shift is required;

a limit value storage section configured to store a variance range limit value of the phase shift; and a shift limit judging section configured to judge whether or not a value of the counter exceeds the limit value of the phase shift, notify a host device of an error if the value of the counter exceeds the limit value, and shift a phase of the sampling clock in accordance with the value of the counter if the value of the counter does not exceed the limit value.

7. The semiconductor device of claim 6, wherein the variance range limit value of the phase shift is either a maximum shift width in a delay direction or a maximum shift width in an advance direction.

8. The semiconductor device of claim 6, wherein the phase shift judging section is configured to sample received data by use of a plurality of clock signals having mutually different phases, and to judge a phase shift of the sampling clock based on obtained data values.

9. The semiconductor device of claim 6, wherein the signal is received from a memory device, a tuning pattern is read from the memory device to perform tuning at the start of data transfer of the memory device, an optimum phase of the sampling clock is determined, and the optimum phase of the sampling clock is provided for a center clock among a plurality of clock signals.

10. The semiconductor device of claim 9, wherein the memory device is an SD card.

11. The semiconductor device of claim 9, wherein the memory device and the host controller are disposed on one chip.

12. A method of performing a phase shift correction of a sampling clock used for sampling a signal, comprising:

judging whether or not a phase shift of the sampling clock is required, and counting up or down a counter in accordance with a shift direction when the phase shift is required; and judging whether or not a value of the counter exceeds a variance range limit value of the phase shift, enabling notification of an error when the value of the counter exceeds the limit value, and shifting the phase of the sampling clock in accordance with the value of the counter when the value of the counter does not exceed the limit value.

13. The method of claim 12, wherein the variance range limit value of the phase shift is either a maximum shift width in a delay direction or a maximum shift width in an advance direction.

14. The method of claim 12, wherein the judging whether or not the phase shift is required comprises sampling received data by use of a plurality of clock signals having mutually different phases, and judging a phase shift of the sampling clock based on obtained data values.

15. The method of claim 12, wherein the signal is received from a memory device, a tuning pattern is read from the memory device to perform tuning at the start of data transfer of the memory device, an optimum phase of the sampling clock is judged, and the optimum phase is provided for a center clock among a plurality of clock signals.

16. The method of claim 15, wherein the memory device is an SD card.

* * * * *